(12) United States Patent
Kwon

(10) Patent No.: US 6,888,873 B2
(45) Date of Patent: May 3, 2005

(54) LONG WAVELENGTH VCSEL BOTTOM MIRROR

(75) Inventor: Hoki Kwon, Plymouth, MN (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/078,422

(22) Filed: Feb. 21, 2002

(65) Prior Publication Data

US 2003/0156616 A1 Aug. 21, 2003

(51) Int. Cl.$^7$ ................................................ H01S 3/08
(52) U.S. Cl. ............................ 372/96; 372/46; 372/97; 372/99
(58) Field of Search ........................... 372/96, 97, 99, 372/45; 438/22

(56) References Cited

U.S. PATENT DOCUMENTS

| | | | |
|---|---|---|---|
| 5,659,180 A | 8/1997 | Shen et al. | |
| 5,679,963 A | 10/1997 | Klem et al. | |
| 5,724,374 A | * 3/1998 | Jewell | 372/45 |
| 5,729,566 A | * 3/1998 | Jewell | 372/96 |
| 5,805,624 A | 9/1998 | Yang et al. | |
| 5,825,796 A | 10/1998 | Jewell et al. | |
| 5,882,948 A | * 3/1999 | Jewell | 438/22 |
| 5,903,586 A | 5/1999 | Ramdani et al. | |
| 5,912,913 A | 6/1999 | Kondow et al. | |
| 5,943,357 A | 8/1999 | Lebby et al. | |
| 5,943,359 A | 8/1999 | Ramdani et al. | |
| 5,956,363 A | 9/1999 | Lebby et al. | |
| 5,960,018 A | 9/1999 | Jewell et al. | |
| 5,978,398 A | 11/1999 | Ramdani et al. | |
| 6,049,556 A | 4/2000 | Sato | |
| 6,052,398 A | 4/2000 | Brilouet et al. | |
| 6,061,381 A | 5/2000 | Adams et al. | |
| 6,493,372 B1 | * 12/2002 | Boucart et al. | 372/96 |
| 6,493,373 B1 | * 12/2002 | Boucart et al. | 372/96 |

FOREIGN PATENT DOCUMENTS

| | | |
|---|---|---|
| EP | 0 715 357 A1 | 6/1996 |
| EP | 0 765 014 A1 | 3/1997 |
| EP | 0 822 630 A1 | 2/1998 |
| EP | 0 874 428 B1 | 4/1998 |
| EP | 0 865 124 | 9/1998 |
| EP | 0 874 428 A2 | 10/1998 |
| EP | 0 874 428 A3 | 11/1998 |
| EP | 0 765 014 B1 | 7/1999 |
| WO | WO 01/033677 A3 | 5/2001 |
| WO | WO 01/033677 A2 | 5/2001 |
| WO | WO 01/63708 A2 | 8/2001 |

OTHER PUBLICATIONS

Kowalsky, W., et al: "Monolithically Integrated InGaAlAs Dielectric Reflectors for Vertical Cavity Optoelectronic Devices," Applied Physics Letters, American Institute of Physics, New York, US, vol 59, No. 9 Aug. 26, 1991 (pp. 1011–1012).

(Continued)

Primary Examiner—Minsun O. Harvey
Assistant Examiner—Dung T Nguyen
(74) Attorney, Agent, or Firm—Workman Nydegger

(57) ABSTRACT

A vertical cavity surface emitting laser having an InP substrate and a lower mirror stack comprised of a plurality of alternating layers of AlPSb and GaPSb over the InP substrate. An InP spacer is over the lower mirror stack. An active region is over the InP spacer, and a tunnel junction is over the active region. Then a top mirror structure comprised of a low-temperature formed first GaAs buffer layer, a high-temperature formed second GaAs seed layer, an insulating structure having an opening, and a GaAs/Al(Ga)As mirror stack that is grown by lateral epitaxial overgrowth.

22 Claims, 4 Drawing Sheets

OTHER PUBLICATIONS

Orsiefer, Markus, et al: "low–Resistance InGa(Al)As Tunnel Junctions for Long Wavelength Vertical–Cavity Surface–Emitting Lasers," Japanese Journal of Applied Physics, Publication Office Japanese Journal of Applied Physics, Tokyo, JP, vol. 39, No. 4A, Part 1, Apr. 1, 2000 (pp. 1727–1729).

Timmons, M.L., et al.: "GaAsSb and AlGaAsSb Tunnel Diodes," Journal of Applied Physics, American Institute of Physics, New York, US, vol. 52, No. 2, Feb. 1981 (pp. 1134–1135).

Bolognesi, C.R., et al.: "InP/GaAsSb/InP Double HBTs: A New Alternative for InP–Based DHBTs," IEEE Transactions on Electron Devices, IEEE, Inc., New York, US, vol. 48, No. 11, Nov. 2001 (pp. 2631–2639).

Akiyama, M., et al., Growth of high quality GaAs layers on Si substrates by MOCVD;, article, Journal of Crystal Growth, vol. 77, 1988, pp. 490–497.

Boucart, J., et al., "Metamorphic OBR and rubbel–junction injection: a CW RT monolithic long–wavelength VCSEL", article, IEEE Journal of Selected Tops in Quantam electronics, vol. 5, No 3, May/Jun. 1999, pp. 520–529.

Boucart, J., et al., "Optimization of the metamorphic growth of GaAs for long wavelength VCSELs", article, Journal of Crystal Growth, 201–202, 1999, pp. 1016–1019.

Demeester, P. et al., "GaAs on InP: a promising material combination", article, Chemtronics, vol 4 Mar. 1989, pp. 44–45.

Goldstein, L, et al., "GaAlAs/GaAs metamorphic Bragg mirror for long wavelength VCSELs", article, Electronics Letters, vol 34, No 3, Feb. 5, 1998, pp. 268–270.

Shimomura, H., et al., "High–reflectance AlPSb/GaPSb distributed Bragg reflector mirrors on InP grown by gas–source molecular beam epitaxy", article, Electronics Letters, vol. 30, No 4, Feb. 17, 1994, pp. 314–315.

Starck, C. "Fabrication of 1.55 um oxidized VCELS with top metamorphic GaAs/GaAlAs and bottom InP/InGaAsP Bragg reflectors", article, IEEE $10^{th}$ International Conference on Indium Phosphide and Related Materials, Tsukuba, Japan, May 11–15, 1998, pp. 369–372.

International Search Report, dated Aug. 12, 2003, relative to PCT application No. PCT/US 03/05471, the foreign equivalent to the instant U.S. Appl. 10/078,422.

"GaAsSb–Based Heterojunction tunnel diodes for tandem solar cell interconnects" Publication Date May 12, 1994.

* cited by examiner

LONG WAVELENGTH VCSEL BOTTOM MIRROR

STATEMENT OF GOVERNMENT INTEREST

The U.S. Government may have rights in this invention pursuant to NIST Contract No. 7ONAHB8H4023.

BACKGROUND OF THE INVENTION

1. Field of the Invention

This invention relates to vertical cavity surface emitting lasers. More specifically, it relates to bottom mirrors used in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Because of their complicated structure, and because of their material requirements, VCSELs are usually grown using metal-organic chemical vapor deposition (MOCVD).

FIG. 1 illustrates a typical VCSEL 10. As shown, an n-doped gallium arsenide (GaAs) substrate 12 has an n-type electrical contact 14. An n-doped lower mirror stack 16 (a DBR) is on the GaAs substrate 12, and an n-type graded-index lower spacer 18 is disposed over the lower mirror stack 16. An active region 20, usually having a number of quantum wells, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof. At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 such that the current flows through the conductive central opening 42 and into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate), different material systems can be used, operational details can be tuned for maximum performance, and additional structures, such as tunnel junctions, can be added. Furthermore, with long wavelengths it is often beneficial to insert a reversed biased n++/p++ tunnel junction between the top spacer 22 and the active region 20, and to change the doping type of the top structures to n-type. This is because p-doped materials absorb more light than n-doped materials, and with longer wavelengths the optical gain become more critical. The tunnel junction converts electrons into holes, which are then injected into the active region.

While generally successful, VCSELs have problems. For example, a major problem in realizing commercial quality long wavelength VCSELs is the available mirror materials. Long wavelength VCSELs are often based on InP material systems. For proper lattice matching, an InP-based VCSEL usually uses InP/InGaAsP or AlInAs/AlInGaAs mirrors. However, because those materials have relatively low refractive index contrasts, 40–50 mirror pairs are typically needed to achieve the required high reflectivity. Growing that number of mirror pairs takes a long time, which increases the production costs.

Other mirror material systems have been tried. For example, "Metamorphic DBR and tunnel-Junction Injection: A CW RT Monolithic Long-Wavelength VCSEL," IEEE Journal of Selected topics In Quantum Electronics, vol. 5, no. 3, May/June 1999, describes an InP-InGaAsP DBR, a GaAlAsSb-AlAsSb DBR, and a GaAlInSb-AlAsSb DBR. Furthermore, that article describes using a reversed biased n++/p++ tunnel junction for injecting current into the active layer. While such mirror material systems are advantageous, their lattice match, refractive index contrast, and thermal conductivity characteristics are not optimal. Additionally, GaAs/Al(Ga) is still considered to form the best distributed Bragg reflector mirrors because of its high refractive index contrast, high thermal conductivity, and the feasibility of using oxidation to enable the formation of oxide insulating regions 40. Thus, new long wavelength VCSELS would be beneficial. Even more beneficial would be new bottom mirror systems for long wavelength VCSELS. Still more beneficial would be new bottom mirror systems that enable GaAs/Al(Ga) top mirror systems.

SUMMARY OF THE INVENTION

Accordingly, the principles of the present invention are directed to new mirror systems for long wavelength VCSELS. Those principles specifically provide for new bottom DBR mirror material systems, and VCSELs that use such new DBR bottom mirror systems. Beneficially, the principles of the present invention provide for VCSELS that incorporate new bottom mirror systems and that use GaAs/Al(Ga) top mirror DBRs.

A bottom mirror according to one aspect of the present invention provides for AlPSb/GaPSb DBR mirrors on an InP substrate, beneficially n-doped. Then, an n-doped bottom InP spacer is grown on the AlPSb/GaPSb DBR. Beneficially, an active region having a plurality of quantum wells is then grown on the n-doped InP spacer. Beneficially, a reversed biased tunnel junction is disposed over the active region. An n-doped top InP spacer is beneficially grown on the tunnel junction. Also beneficially, an n-doped GaAs/Al(Ga)As top DBR is grown on the n-doped top InP spacer.

Preferably, the GaAs/Al(Ga)As top DBR is grown by a multi-step process using MOCVD. First, the growth temperature is set to 400–450° C. Then, a 20–40 nanometer thick low temperature GaAs layer is grown on the n-doped top InP spacer. After that, the temperature is increased to around 600° C. A high temperature GaAs seed layer, about 100 nm thick, is then grown on the low temperature GaAs layer. Then an insulation layer comprised of $SiO_2$ or $Si_2N_4$ is formed on the GaAs seed layer. The insulation layer is patterned to form an opening. A high temperature GaAs layer is then grown on the GaAs seed layer, followed by a GaAs/Al(Ga)As top DBR. The high temperature GaAs layer and the GaAs/Al(Ga)As mirror are beneficially grown using lateral epitaxial overgrowth.

According to another aspect of the present invention, a bottom AlGaInAs/AlInAs DBR is grown on an n-doped InP substrate. Then, an n-doped bottom InP spacer is grown on the grown on the AlGaInAs/AlInAs DDR. Beneficially, an active region having a plurality of quantum wells is then grown on the n-doped InP spacer, followed by a reversed biased $n^{++}/p^{++}$ tunnel junction over the active region. An n-doped top InP spacer is beneficially grown on the tunnel junction. Also beneficially, an n-doped GaAs/Al(Ga)As top DER is grown on the n-doped top InP spacer.

Preferably, the GaAs/Al(Ga)As top DBR is grown by a multi-step process using MOCVD. First, the growth temperature is set to 400–450° C. Then, a 20–40 nanometer thick low temperature GaAs layer is grown on the n-doped top InP spacer. After that, the temperature is increased to around 600° C. A high temperature GaAs seed layer, about 100 nm thick, is then grown on the low temperature GaAs layer. Then, an insulation layer comprised of $SiO_2$ or $Si_2N_4$ is formed on the GaAs seed layer. That insulation layer is then patterned to form an opening. A high temperature GaAs layer is then grown on the GaAs seed layer. Then, a GaAs/Al(Ga)As top DBR is grown on the high temperature GaAs layer. The GaAs layer and the GaAs/Al(Ga)As mirror are beneficially grown using lateral epitaxial overgrowth.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
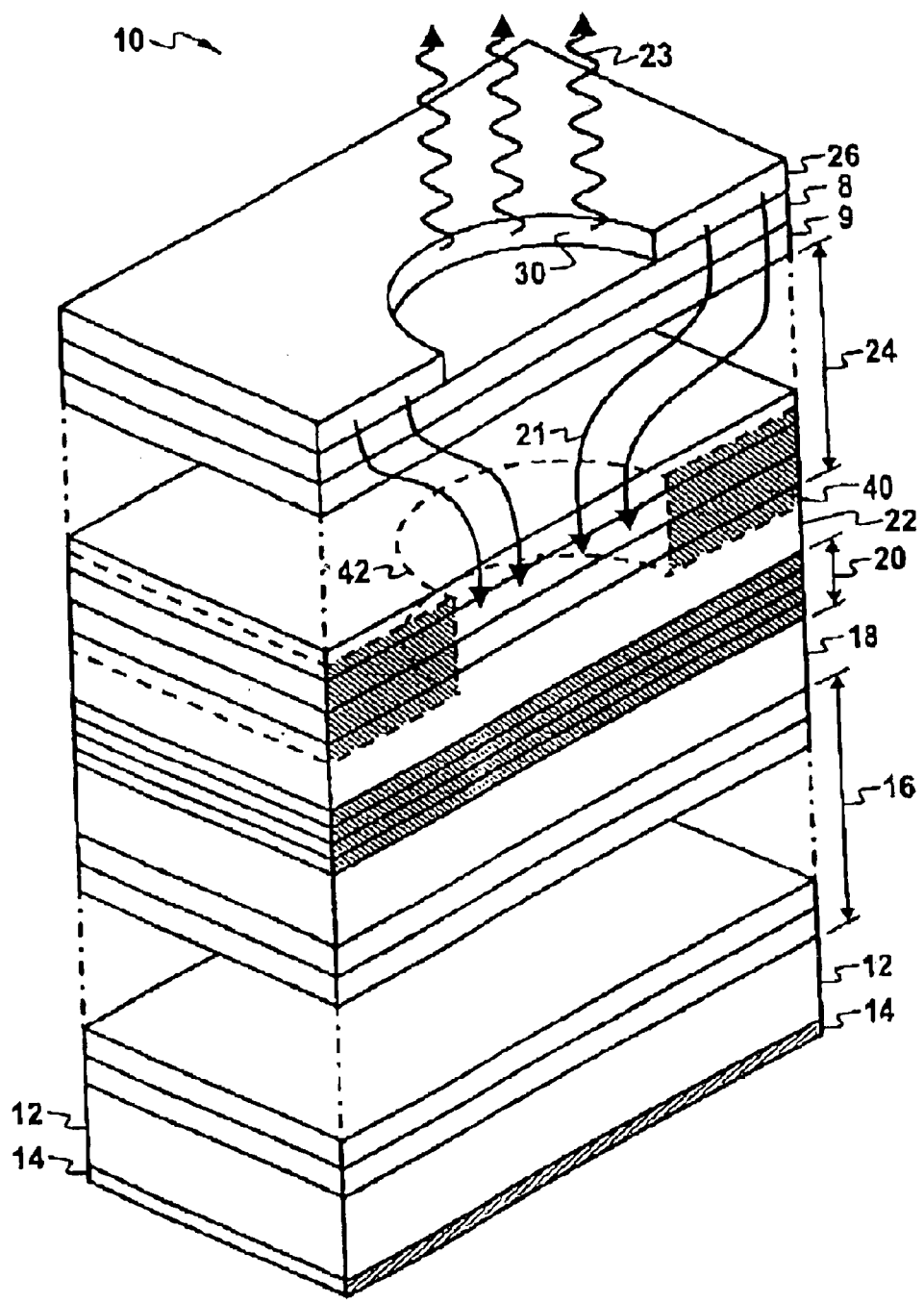
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

The principles of the present invention are incorporated in a first embodiment VCSEL having a bottom AlPSb/GaPSb DBR mirror grown on an InP substrate. An example of such a VCSEL is the VCSEL 100 illustrated in FIG. 2.

Figure 2:
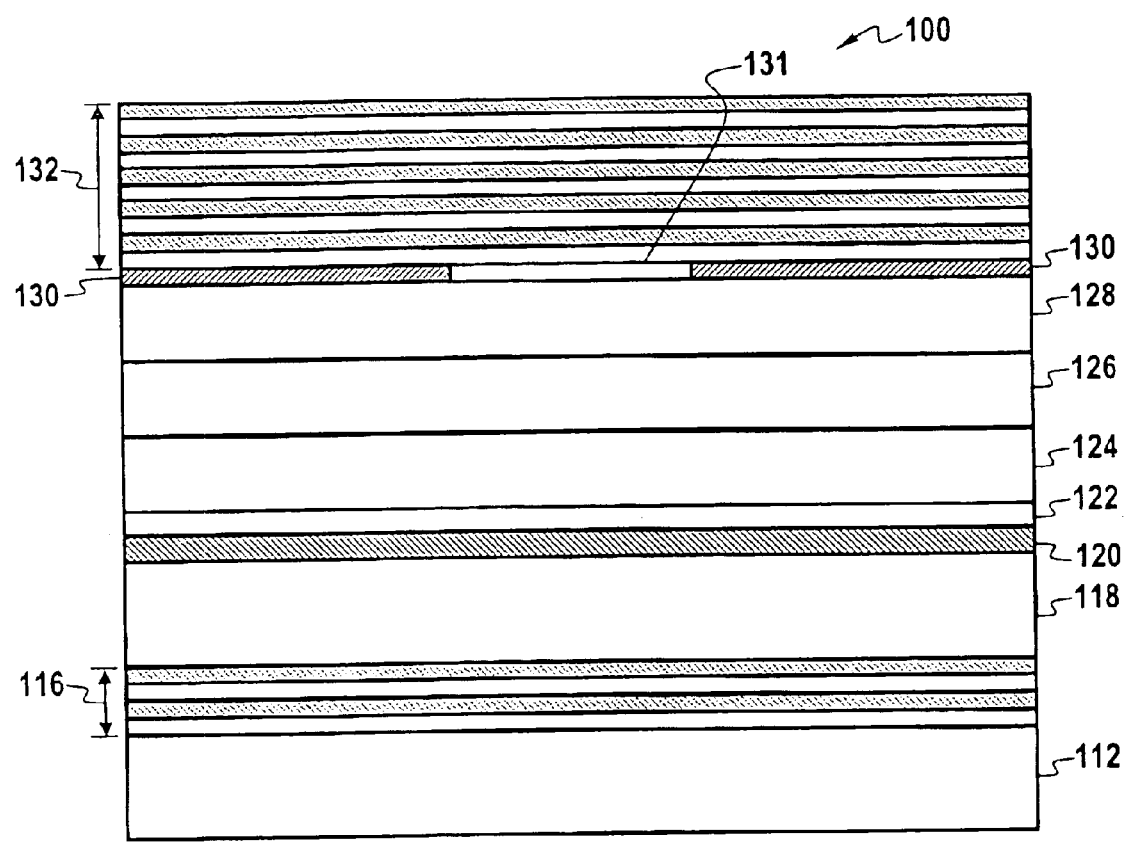
FIG. 2 illustrates a first embodiment vertical cavity surface emitting laser that is in accord with the principles of the present invention.

As shown in FIG. 2, the VCSEL 100 includes an n-doped InP substrate 112 having an n-type electrical contact (not shown for clarity). Over the InP substrate 112 is an n-doped lower mirror stack 116 (a DBR) comprised of a plurality of alternating layers of AlPSb/GaPSb. Over the lower mirror stack 116 is an n-doped InP spacer 118. The lower mirror stack 116 is beneficially grown on the InP substrate using TMAl, TMSb, and $PH_3$ in an MOCVD process. Then, the InP spacer 118 is grown, also using MOCVD. An active region 120 comprised of P-N junction structures and a large number of quantum wells is then formed over the InP spacer 118. The composition of the active region 120 is beneficially AlInGaAs or InGaAsP.

Over the active region 120 is a tunnel junction 122 comprised of a reverse biased n++/p++ junction. Beneficially, the tunnel junction includes a p-layer comprised of MOCVD-grown $GaAs_{(1-x)}Sb_x$. During MOVCD, TMGa (or TEGa), TMSb, and $AsH_3$ (or TBAs) are beneficially used to produce the $GaAs_{(1-x)}Sb_x$ layer. Beneficially, that layer's solid composition is controlled by controlling the ratio of As to Sb. The MOCVD growth temperature is between 500° C. and 650° C. Doping is beneficially performed using $CCl_4$ or $CBr_4$ such that the resulting p-doping is greater $1 \times 10^{19}$ $cm^{-3}$. In practice, a p-doping greater than $5 \times 10^{19}$ $cm^{-3}$ is beneficial. It should be noted that the $GaAs_{(1-x)}Sb_x$ layer can have a doping as high as $1 \times 10^{20}$ $cm^{-3}$ without annealing. By setting x=0.5 a tunnel junction that is lattice matched to InP is produced (but $GaAs_{(0.5)}Sb_{0.5}$ has a bandgap of 0.71 eV at 300K). An alternative is to set x=0.4, 0.3, or 0.23, which produce $GaAs_{(1-x)}Sb_x$ layers with bandgaps of 0.8 eV, 0.91 eV, or 1 eV, but which are not lattice matched to the InP active region 120. At x=0.3, or 0.23 the strains respectively become 1.4% or 1.95%, which, while not ideal, are much better than the 3.55% strain of AlAs on InP.

The tunnel junction 122 further includes an n-doped layer of InP, AlInAs, or of a lower bandgap material such as AlInGaAs or InGaAsP. The n-doped layer should also be heavily doped (greater than $5 \times 10^{19}$ $cm^{-3}$) and very thin (less than about 10 nanometers). For good lattice matching, the VCSEL 100 uses an InP n-type layer in the tunnel junction 122.

Over the tunnel junction 122 is an n-type InP top spacer 124. Then, a top mirror structure (which includes another DBR) is disposed over the top spacer 124.

The top mirror structure is beneficially comprised of a low temperature grown GaAs buffer layer 126 over the top spacer 124, a high temperature GaAs buffer layer 128 (which acts as a seed layer) over the GaAs buffer layer 126, an insulating structure (beneficially comprised of SiO$_2$) 130 over most of the GaAs buffer layer 128, and a GaAs/Al(Ga)As mirror stack 132 over the insulating structure 130. A shown, the insulating structure includes an opening 131, which enables current flow through the VCSEL 100.

The top mirror structure implements a device quality GaAs/Al(Ga)As mirror stack 132 over the top spacer 124. In many applications, GaAs/Al(Ga)As is considered the best material for Bragg mirrors because of its high refractive index contrast (GaAs:AlAs=3.377:2.893), high thermal conductivity (GaAs:AlAs=0.46:0.8), and its oxidation potential. However, GaAs/Al(Ga)As is seriously lattice mismatched with InP. Thus, to produce a device-quality GaAs/Al(Ga)As mirror stack, MOCVD is used in a two-step process to form intermediate GaAs buffer layers.

Figure 3:
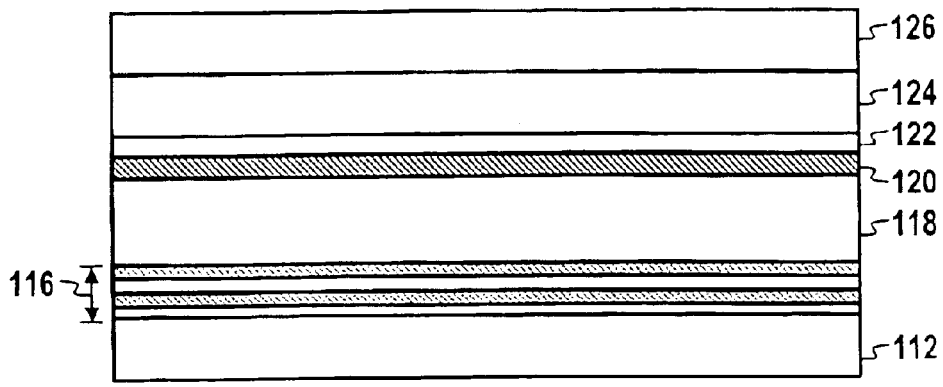
FIG. 3 illustrates an intermediate structure during fabrication of the vertical cavity surface emitting laser illustrated in FIG. 2.

FIG. 3 illustrates the first step of the two-step process. A low temperature GaAs buffer layer 126 is formed over the InP spacer 124. The low temperature GaAs buffer layer 126 is produced by adjusting the MOCVD growth temperature to about 400–450° C., and then MOCVD growing the low temperature GaAs buffer layer 126 to a thickness of about 20–40 nm.

Figure 4:
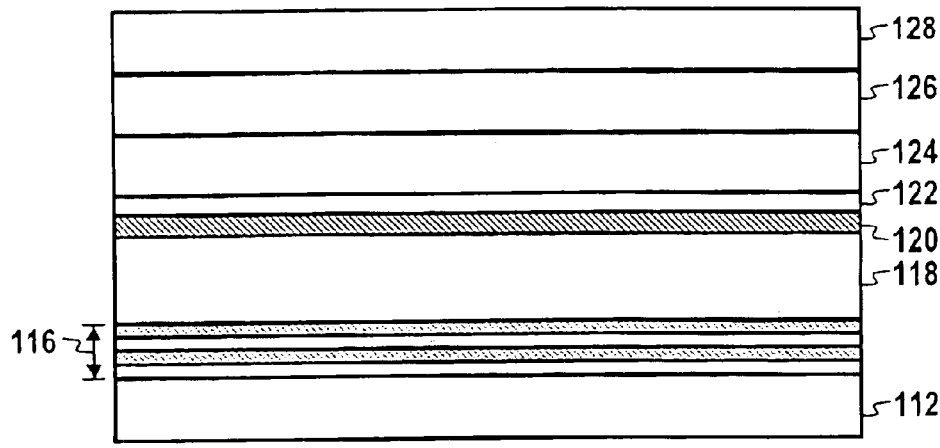
FIG. 4 illustrates another intermediate structure during fabrication of the vertical cavity surface emitting laser illustrated in FIG. 2.

Referring now to FIG. 4, after the low temperature GaAs buffer layer 126 is formed, the temperature is increased to around 600° C. Then, the high temperature GaAs buffer layer 128 is grown. The GaAs buffer layer 128 acts as a seed layer for subsequent growths.

Figure 5:
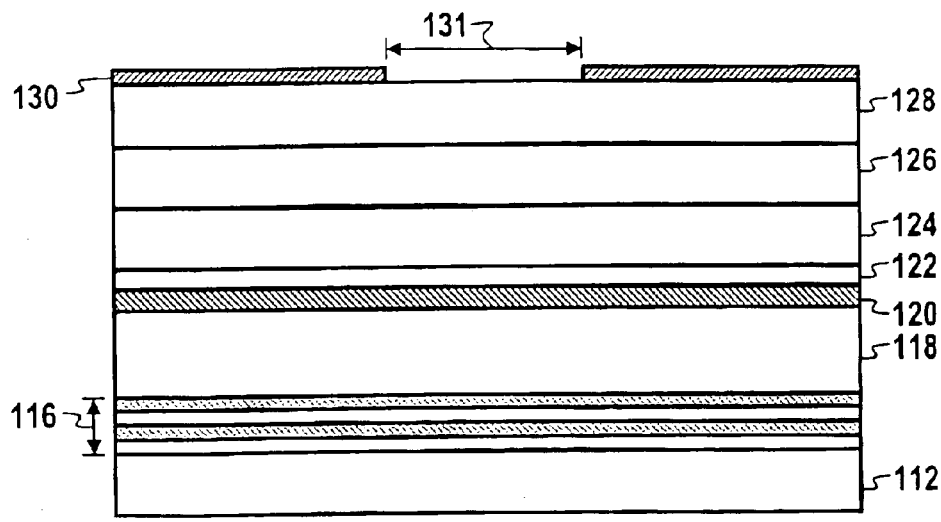
FIG. 5 illustrates yet another intermediate structure during fabrication of the vertical cavity surface emitting laser illustrated in FIG. 2.

Referring now to FIG. 5, after the GaAs buffer layer 128 is grown, a dielectric layer of SiO$_2$ (alternatively of Si$_3$N$_4$) is deposited and patterned to form the insulating structure 130. To do so, the intermediate structure shown in FIG. 4 is removed from the MOCVD reactor vessel. Then, a dielectric layer of SiO$_2$ (alternatively Si$_3$N$_4$) is deposited on the insulating structure 130. Then, the deposited dielectric layer is patterned to produce the insulating structure 130 having the opening 131. The insulating structure 130 provides a suitable surface for lateral epitaxial overgrowth. After the insulating structure 130 formed, the intermediate structure of FIG. 5 is inserted into the MOCVD reactor vessel. Referring once again to FIG. 2, the GaAs/Al(Ga)As mirror stack 132 is then grown by MOCVD. That mirror stack is produced by lateral epitaxial overgrowth from the GaAs buffer layer 128 through the opening 131. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) are produced.

Figure 6:
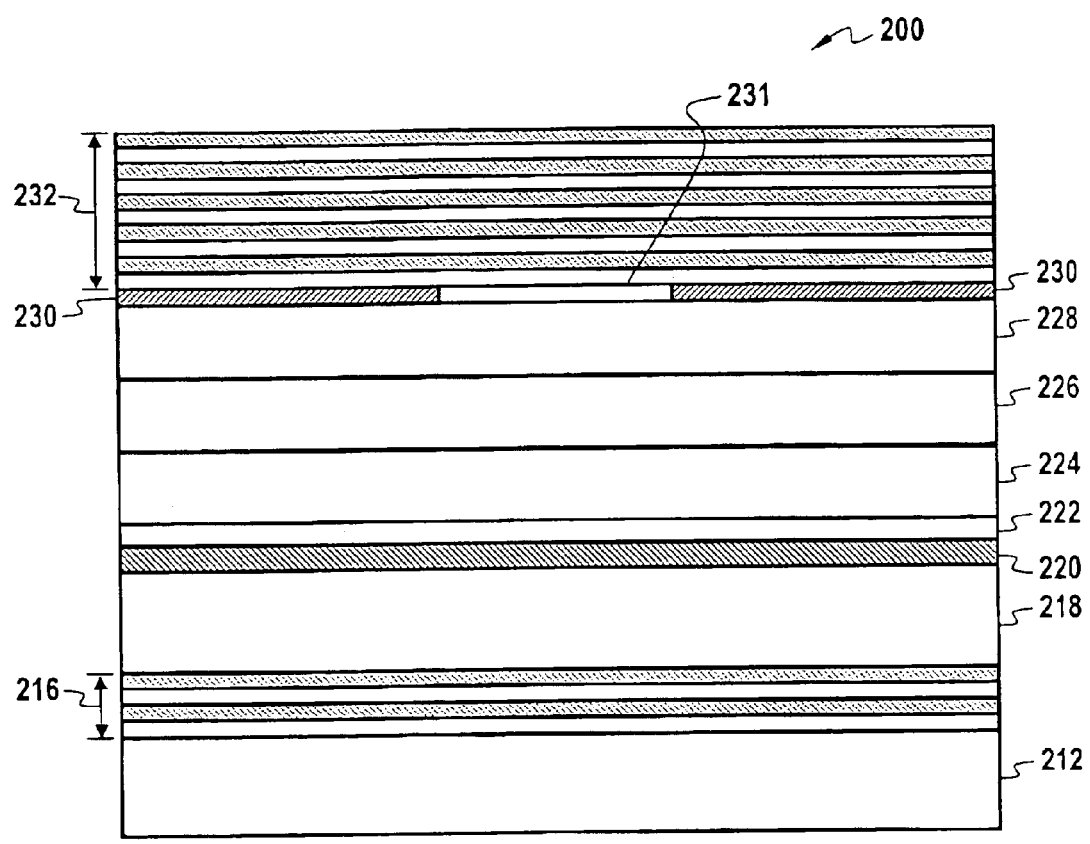
FIG. 6 illustrates a second embodiment vertical cavity surface emitting laser that is in accord with the principles of the present invention.

An alternative embodiment VCSEL 200 that is in accord with the principles of the present invention is illustrated in FIG. 6. The VCSEL 200 includes an n-doped InP substrate 212 having an n-type electrical contact (which is not shown for clarity). Over the InP substrate 222 is n-doped lower mirror stack 216 (a DBR) comprised of a plurality of alternating layers of AlGaInAs and AlInAs. Over the lower mirror stack 216 is an InP spacer 218. The lower mirror stack 216 is beneficially grown on the InP substrate using TMAl, TMSb, and PH$_3$ in an MOCVD process. Then, the InP spacer 218 is grown, also using MOCVD.

An active region 220 comprised of P-N junction structures and a large number of quantum wells are then formed over the InP spacer 218. The composition of the active region 220 is beneficially InP. Over the active region 220 is a tunnel junction 222 comprised of a reverse biased n++/p++ junction. Beneficially, the tunnel junction 22 is as described above (and thus includes a MOCVD-grown GaAs$_{(1-x)}$Sb$_x$ layer).

Over the tunnel junction 222 is an n-type InP top spacer 224. Then, a top mirror structure (which includes another DBR) is disposed over the top spacer 224. The top mirror structure is beneficially comprised of a low temperature GaAs buffer layer 226 over the top spacer 224, a high temperature GaAs buffer layer 228 over the GaAs buffer layer 226, an insulating structure (beneficially comprised of SiO$_2$) 130 over most of the GaAs buffer layer 228, and a GaAs/Al(Ga)As mirror stack 232 over the insulating structure 230. Beneficially, the top mirror structure is fabricated in the same manner as the top mirror structure of FIG. 2 (as discussed with regard to FIGS. 3–5).

With the mirror stack 232 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) are produced.

The VCSELs 100 and 200 have significant advantages over prior art long wavelength InP VCSELs. First, the two-step MOCVD process enables a device quality GaAs/Al(Ga)As top mirror to be used with an InP active region 120 and an InP top spacer 124. Another advantage is that the tunnel junction 122 enables n-doped top layers to be used, which reduces optical absorption (which can be critically important in long wavelength VCSELs). Yet another advantage is the avoidance of InP/InGaAsP mirror stacks, which requires a large numbers of mirror pairs. Consequently, a reduction in mirror growth times and costs is possible. Furthermore, the mirrors stacks used in the VCSEL 100 and in the VCSEL 200 enable improved thermal performance. Still another advantage is the ease of forming current confinement in the top mirror structure, and the use of lateral epitaxial overgrowth to produce the top mirror. The overall result is VCSELs having improved performance, increased reliability, faster fabrication, and reduced cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser, comprising:
   an InP substrate,
   a lower minor stack comprised of a plurality of alternating layers of AlPSb and GaPSb over the InP substrate:
   an active region over the lower mirror stack;
   a top mirror stack over the active region, the top mirror stack comprising:
      a first GaAs buffer layer;
      a second GaAs seed layer over the first GaAs buffer layer; and
      a plurality of alternating layers of GaAs and Al(Ga)As over the second GaAs seed layer,
   wherein the top mirror stack is grown by MOCVD.

2. A vertical cavity surface emitting laser according to claim 1, wherein the alternating layers of AlPSb and GaPSb are grown by MOCVD.

3. A vertical cavity surface emitting laser according to claim 1, further including a lower InP spacer over the lower mirror stack.

4. A vertical cavity surface emitting laser according to claim 3, wherein the lower InP spacer is grown by MOCVD.

5. A vertical cavity surface emitting laser according to claim 1, wherein the active region includes AlInGaAs or InGaAsP.

6. A vertical cavity surface emitting laser according to claim 5, further including a tunnel junction over the active region.

7. A vertical cavity surface emitting laser according to claim 6, wherein the tunnel junction includes an MOCVD-grown $GaAs_{(1-x)}Sb_x$ layer.

8. A vertical cavity surface emitting laser according to claim 1, wherein the first GaAs buffer layer is grown by MOCYD between 400° C. and 450° C.

9. A vertical cavity surface emitting laser according to claim 1, wherein the second GaAs seed layer is grown by MOCVD at about 600° C.

10. A vertical cavity surface emitting laser according to claim 9, further including an insulating structure on the second GaAs seed layer, wherein the insulating structure includes an opening.

11. A vertical cavity surface emitting laser according to claim 9, wherein tho GaAs/Al(Ga)As top mirror stack is grown by lateral epitaxcial overgrowth from the second GaAs seed layer.

12. A vertical cavity surface emitting laser, comprising:
   an InP substrate;
   a lower mirror stack comprised of a plurality of alternating layers of AlGaInAs and AlInAs over the lnP substrate;
   an active region over the lower mirror stack;
   a ton mirror stack over the active region, the top mirror stack comprising;
      a first GaAs buffer layer;
      a second GaAs secd layer over the first GaAs buffer layer; and
      a plurality of alternating layers of GaAs and Al(Ga)As over the second GaAs seed layer,
   wherein the top mirror stack is grown by MOCVD.

13. A vertical cavity surface emitting laser according to claim 12, further including a lower InP spacer over the lower mirror stack.

14. A vertical cavity surface emitting laser according to claim 13, wherein the lower InP spacer is grown by MOCVD.

15. A vertical cavity surface emitting laser according to claim 12, wherein the active region includes AlInGaAs or InGaAsP.

16. A vertical cavity surface emitting laser according to claim 15, further including a tunnel junction over the active region.

17. A vertical cavity surface emitting laser according to claim 16, wherein the tunnel junction includes a MOCVD-grown $GaAs_{(1-x)}Sb_x$ layer.

18. vertical cavity surface emitting laser according to claim 12, wherein the first GaAs buffer layer is grown by MOCVD between 400° C. and 450° C., and wherein the second GaAs seed layer is grown by MOCVD at about 600° C.

19. A vertical cavity surface emitting laser according to claim 18, further including an insulating structure on the second GaAs seed layer, wherein the insulating structure includes an opening.

20. A vertical cavity surface emitting laser according to claim 18, wherein the GaAs/Al(Ga)As top mirror stack is grown by lateral epitaxial overgrowth from the second GaAs iced layer.

21. A vertical cavity surface emitting laser according to claim 1 wherein the first GaAs buffer layer is grown by MOCVD over 400° C.

22. A vertical cavity surface emitting laser according to claim 12 wherein the first GaAs buffer layer is grown by MOCVD over 400° C. and thc second GaAs seed layer is grown by MOCVD at about 600° C.

* * * * *